United States Patent
Kando

(10) Patent No.: US 8,049,395 B2
(45) Date of Patent: Nov. 1, 2011

(54) BOUNDARY ACOUSTIC WAVE DEVICE

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 110 days.

(21) Appl. No.: 12/482,604

(22) Filed: Jun. 11, 2009

(65) Prior Publication Data

US 2009/0236935 A1 Sep. 24, 2009

Related U.S. Application Data

(63) Continuation of application No. PCT/JP2007/072559, filed on Nov. 21, 2007.

(30) Foreign Application Priority Data

Dec. 25, 2006 (JP) .................................. 2006-347575

(51) Int. Cl.
*H01L 41/09* (2006.01)

(52) U.S. Cl. ............. 310/313 R; 310/313 A; 310/313 B

(58) Field of Classification Search .............. 310/313 B, 310/313 A, 313 R, 313 D, 311; 333/133, 333/193–199; *H01L 41/09, 41/08; H03H 9/25*
See application file for complete search history.

(56) References Cited

U.S. PATENT DOCUMENTS

| | | | |
|---|---|---|---|
| 6,046,656 A | 4/2000 | Mishima | |
| 7,741,931 B2 * | 6/2010 | Matsuda et al. | 310/313 B |
| 7,915,786 B2 * | 3/2011 | Matsuda et al. | 310/313 D |
| 2004/0135650 A1 | 7/2004 | Miura et al. | |
| 2004/0226162 A1 | 11/2004 | Miura et al. | |
| 2006/0071579 A1 | 4/2006 | Kando | |
| 2006/0138902 A1 | 6/2006 | Kando | |
| 2007/0007852 A1 | 1/2007 | Kando | |
| 2007/0085629 A1 | 4/2007 | Kando | |
| 2009/0212659 A1 * | 8/2009 | Matsuda et al. | 310/313 D |

FOREIGN PATENT DOCUMENTS

| | | |
|---|---|---|
| EP | 1 879 291 A1 | 1/2008 |
| JP | 05-048383 A | 2/1993 |
| JP | 05-095249 A | 4/1993 |
| JP | 3090810 U | 12/2002 |
| JP | 2004-186868 A | 7/2004 |
| JP | 2004-343359 A | 12/2004 |
| WO | 98/52279 A1 | 11/1998 |
| WO | 2004/070946 A1 | 8/2004 |
| WO | 2005/069485 A1 | 7/2005 |
| WO | 2005/069486 A1 | 7/2005 |
| WO | 2005-099091 A1 | 10/2005 |
| WO | 2006/114930 A1 | 11/2006 |

OTHER PUBLICATIONS

Official Communication issued in International Patent Application No. PCT/JP2007/072559, mailed on Feb. 26, 2008. Official Communication issued in corresponding Japanese Patent Application No. 2008-550998, mailed on Jul. 26, 2011.

* cited by examiner

*Primary Examiner* — Walter Benson
*Assistant Examiner* — Karen B Addison
(74) *Attorney, Agent, or Firm* — Keating & Bennett, LLP

(57) ABSTRACT

A boundary acoustic wave device includes an IDT electrode between a piezoelectric layer and a dielectric layer. A low thermal expansion medium layer having a linear thermal expansion coefficient less than that of the piezoelectric layer is laminated on the piezoelectric layer opposite to the boundary. Acoustic velocities of transversal waves at the piezoelectric layer, the dielectric layer, and the low thermal expansion medium layer satisfy Expression (1), and (an acoustic velocity of a transverse wave at the dielectric layer)/$\lambda$ satisfies Expression (2) as follows:

(acoustic velocity of transverse wave at dielectric layer)<(acoustic velocity of SH wave at piezoelectric layer)<(acoustic velocity of transverse wave at low thermal expansion medium layer)
                                                        Expression (1), and (response frequency of boundary acoustic wave)<(acoustic velocity of transverse wave at dielectric layer)/$\lambda$<(response frequency of high order mode)
                                                        Expression (2).

12 Claims, 7 Drawing Sheets

BOUNDARY ACOUSTIC WAVE DEVICE

BACKGROUND OF THE INVENTION

1. Field of the Invention

The present invention relates to a boundary acoustic wave device used for a resonator or a band-pass filter, for example. More particularly, the present invention relates to a boundary acoustic wave device using a boundary acoustic wave that propagates at the boundary between a piezoelectric layer and a dielectric layer.

2. Description of the Related Art

Conventionally, a surface acoustic wave device has been widely used for a band-pass filter of a mobile phone or the like. For example, Japanese Unexamined Patent Application Publication No. 2004-186868 discloses a surface acoustic wave filter. FIG. 14 illustrates the structure of the filter.

A surface acoustic wave filter 501 shown in FIG. 14 includes a piezoelectric layer 502 made of $LiTaO_3$, and an IDT electrode 503 disposed on the piezoelectric layer 502. Sapphire 504 is attached to the back surface of the piezoelectric layer 502 opposite to a surface on which the IDT electrode 503 is disposed. Assuming that T is a thickness of the piezoelectric layer 502 and $\lambda$ is a wavelength of a surface acoustic wave to be used, a ratio $T/\lambda$ of the thickness of the piezoelectric layer 502 to the wavelength $\lambda$ of the surface acoustic wave is at least 10. Accordingly, a spurious response is decreased, which is generated by the reflection of a bulk acoustic wave (BAW) at the boundary surface between the piezoelectric layer 502 and the sapphire 504.

Recently, a boundary acoustic wave device has been used instead of the surface acoustic wave device. The boundary acoustic wave device uses a boundary acoustic wave that propagates at the boundary between a piezoelectric layer and a dielectric layer. In the surface acoustic wave device, to excite the IDT electrode provided on the surface of the piezoelectric layer, a gap must be provided so as not to interrupt the vibration. Thus, the surface acoustic wave device has a relatively complicated and large package structure. In contrast, the boundary acoustic wave device uses the boundary acoustic wave that propagates at the boundary between the piezoelectric layer and the dielectric layer. Thus, a gap is not required, and the boundary acoustic wave device may have a relatively simple and small package.

Also, WO 2005/069486 discloses a boundary acoustic wave device having a layer structure including a sound absorbing medium, $SiO_2$, an IDT electrode, and $LiNbO_3$. Here, an acoustic velocity of a transverse wave at the sound absorbing medium is lower than an acoustic velocity of a transverse wave at $SiO_2$. The sound absorbing medium is made of epoxy resin or porous $SiO_2$. A high order mode spurious response is suppressed by providing the sound absorbing medium.

In addition, WO 98/52279 discloses a boundary acoustic wave device having a layer structure including a polycrystalline silicon film, a polycrystalline silicon oxide film, an IDT, and a single crystal piezoelectric substrate. Here, since the polycrystalline silicon film is provided, a boundary acoustic wave excited at the IDT electrode is enclosed in a portion before the polycrystalline silicon oxide film. The IDT electrode is reliably protected by the polycrystalline silicon film and the polycrystalline silicon oxide film.

Further, WO 2004/070946 discloses a boundary acoustic wave device in which an IDT electrode is arranged at the boundary between a piezoelectric layer and a dielectric layer and which uses a SH boundary acoustic wave. Here, the thickness of the IDT electrode is determined such that an acoustic velocity of the SH boundary wave is lower than acoustic velocities of transverse waves propagating at the dielectric layer and the piezoelectric layer. With this structure, an electromechanical coupling coefficient may be relatively large, a propagation loss and a power flow angle may be relatively small, and a temperature coefficient of frequency TCF may be set within a proper range.

In the boundary acoustic wave device, a higher order mode spurious response must be suppressed.

As described in Japanese Unexamined Patent Application Publication No. 2004-186868, the surface acoustic wave device can decrease the higher order mode spurious response as long as a solid, such as sapphire, is attached to the surface of the piezoelectric layer opposite to the surface on which the IDT electrode is disposed, and the ratio of the thickness of the piezoelectric layer to the wavelength of the surface wave is within a specific range.

Japanese Unexamined Patent Application Publication No. 2004-186868 discloses an example in paragraphs [0036] to [0042] in which an IDT electrode is provided on the front surface of 42° Y-cut X-propagation $LiTaO_3$, and an R-plane cut sapphire substrate is laminated on the back surface of the $LiTaO_3$. In this configuration, a first leaky surface wave primarily having an SH component propagates on the front surface of the $LiTaO_3$ substrate. Paragraph (0034) of Japanese Unexamined Patent Application Publication No. 2004-186868 describes that, with the above-described structure, a spurious response may be generated by reflection of BAW at the boundary surface between the $LiTaO_3$ and the sapphire substrate.

In contrast, based on the knowledge of the inventor of the present application, a generated spurious response is a high order propagation mode in which a P wave, a SH wave, and a SV wave propagate in a coupled manner. An acoustic velocity of the SV wave propagating in a propagation direction at the $LiTaO_3$ with this cut direction is 3351 m/s, and an acoustic velocity of the SH wave is 4277 m/s. An acoustic velocity of a transverse wave at the sapphire is 6463 m/s. Since the acoustic velocity of the transverse wave at the sapphire is higher than the acoustic velocity of the SH wave at the $LiTaO_3$, a high order mode spurious response primarily having a SH component and a high order mode spurious response primarily having a P+SV component are generated at the boundary between the sapphire and the $LiTaO_3$. The 42° Y-cut X-propagation $LiTaO_3$ substrate causes the SH wave to be strongly excited. Thus, a high order mode spurious response primarily having a SH component is strongly generated.

Japanese Unexamined Patent Application Publication No. 2004-186868 decreases the high order mode spurious response by increasing the thickness of the $LiTaO_3$ substrate.

However, in Japanese Unexamined Patent Application Publication No. 2004-186868, when a frequency characteristic of FIG. 6 when the $LiTaO_3$ substrate has a small thickness is compared with a frequency characteristic of FIG. 10 when the LiTaO₃ substrate has a large thickness, a spurious response is suppressed to a greater extent in FIG. 10 of Japanese Unexamined Patent Application Publication No. 2004-186868 than in FIG. 6 of Japanese Unexamined Patent Application Publication No. 2004-186868. However, the number of appearances of spurious responses is increased. Namely, excitation intensity in a high order mode which may cause the spurious response is decreased by increasing the thickness of the LiTaO₃ substrate. However, high order modes of many orders are included. Thus, a filter characteristic of the surface wave device is not sufficiently improved.

In WO 2005/069486, the sound absorbing medium with an acoustic velocity of a transverse wave lower than the acoustic velocity of the transverse wave at the SiO₂ is provided on the SiO₂. Accordingly, the high order mode can be decreased. However, a resin material, such as epoxy resin, polyimide, or liquid crystal polymer, which is used as the sound absorbing medium has a high linear thermal expansion coefficient. If the intensity of the structure including the SiO₂, the IDT, and the LiNbO₃ for propagation of the boundary acoustic wave is not sufficient, the structure may likely be expanded or contracted in accordance with the temperature of the boundary acoustic wave device on account of the effect applied by the linear thermal expansion coefficient of the sound absorbing medium. Thus, the absolute value of the temperature coefficient of frequency TCF of the boundary acoustic wave device may be increased.

With the boundary acoustic wave device disclosed in WO 98/52279, the piezoelectric single crystal substrate made of, for example, LiNbO₃, is attached to Si with a small thermal expansion coefficient. Accordingly, the absolute value of the temperature coefficient of frequency TCF can be decreased. In this case, by providing SiO₂, which is a low acoustic velocity material, is arranged between the Si and the LiNbO₃ which are high acoustic velocity materials, a main propagation mode of the boundary acoustic wave is enclosed within the SiO₂ region.

With the boundary acoustic wave device disclosed in WO 2004/070946, where metal, such as Au, that is heavier than Al is used instead of Al which is as light as SiO₂, vibration energy in a main mode of the boundary acoustic wave does not spread over the entire SiO₂, but is concentrated at the piezoelectric substrate. Thus, an electromechanical coupling coefficient $K^2$ of the boundary acoustic wave can be increased.

However, with the structure in which the low acoustic velocity medium is arranged between the high acoustic velocity media such as the boundary acoustic wave device disclosed in WO 98/52279, the acoustic velocity may vary depending on the thickness and the film quality of the low acoustic velocity medium. As a result, a frequency variation may appear in the boundary acoustic wave device. Thus, precise quality control of the thickness and the film quality of the low acoustic velocity medium is required.

By increasing the thickness of the low acoustic velocity medium, the effect of variations in energy distribution in the main mode of the boundary acoustic wave due to variations in the thickness of the low acoustic velocity medium can be decreased. However, if the thickness of the low acoustic velocity medium is increased, a high order mode spurious response may be generated.

As described in WO 2005/069486, WO 98/52279, and WO 2004/070946, in the conventional boundary acoustic wave devices, various arrangements have been used to attempt to suppress the high order mode spurious response, to increase the electromechanical coupling coefficient, and to decrease the absolute value of the temperature coefficient of frequency TCF. However, unlike surface acoustic wave devices, with boundary acoustic wave devices, the high order mode spurious response is not sufficiently decreased.

SUMMARY OF THE INVENTION

To overcome the problems described above, preferred embodiments of the present invention provide a boundary acoustic wave device which can effectively decrease a response intensity of a high order mode spurious response with a relatively simple structure without significantly increasing the number of spurious responses, and which can provide good filter characteristics and good resonance characteristics.

According to a first preferred embodiment of the present invention, a boundary acoustic wave device includes a piezoelectric layer, a dielectric layer laminated on the piezoelectric layer, an IDT electrode arranged at the interface between the piezoelectric layer and the dielectric layer, and a low thermal expansion medium layer laminated on a surface of the piezoelectric layer opposite to the interface and made of a material having a linear thermal expansion coefficient that is lower than that of the piezoelectric layer. The boundary acoustic wave device uses a SH boundary acoustic wave propagating at the boundary between the piezoelectric layer and the dielectric layer. An acoustic velocity of a SH wave at the piezoelectric layer satisfies Expression (1), and when λ represents a wavelength of the IDT electrode, (an acoustic velocity of a transverse wave at the dielectric layer)/λ with respect to a response frequency of the SH boundary acoustic wave and to a response frequency in a high order mode satisfies a range defined by Expression (2) as follows:

(acoustic velocity of transverse wave at dielectric layer)<(acoustic velocity of SH wave at piezoelectric layer)<(acoustic velocity of transverse wave at low thermal expansion medium layer)

Expression (1), and (response frequency of boundary acoustic wave)< (acoustic velocity of transverse wave at dielectric layer)/λ<(response frequency of high order mode)

Expression (2).

According to a second preferred embodiment of the present invention, a boundary acoustic wave device includes a piezoelectric layer, a dielectric layer laminated on the piezoelectric layer, an IDT electrode arranged at the interface between the piezoelectric layer and the dielectric layer, and a low thermal expansion medium layer laminated on a surface of the piezoelectric layer opposite to a surface on which the IDT electrode is provided and made of a material having a linear thermal expansion coefficient that is lower than that of the piezoelectric layer. The boundary acoustic wave device uses a Stoneley boundary acoustic wave propagating at the boundary between the piezoelectric layer and the dielectric layer. An acoustic velocity of a SV wave at the piezoelectric layer satisfies Expression (3), and when λ represents a wavelength of the IDT electrode, (an acoustic velocity of a transverse wave at the dielectric layer)/λ with respect to a response frequency of the Stoneley boundary acoustic wave and to a response frequency in a high order mode satisfies a range defined by Expression (4) as follows:

(acoustic velocity of transverse wave at dielectric layer)<(acoustic velocity of SV wave at piezoelectric layer)<(acoustic velocity of transverse wave at low thermal expansion medium layer)  Expression (3), and (response frequency of boundary acoustic wave)<(acoustic velocity of transverse wave at dielectric layer)/λ<(response frequency of high order mode)  Expression (4).

In the preferred embodiments of the present invention, "a transverse wave at a dielectric layer" and "a transverse wave at a low thermal expansion medium layer" preferably represent S waves when the dielectric layer and the low thermal expansion medium layer are made of materials which are not anisotropic. Alternatively, the dielectric layer and the low thermal expansion medium layer may preferably be made of anisotropic materials. If the anisotropic materials are used, in the first preferred embodiment, "the transverse wave at the dielectric layer" and "the transverse wave at the low thermal expansion medium layer" become SH transverse waves. In the second preferred embodiment, "the transverse wave at the dielectric layer" and "the transverse wave at the low thermal expansion medium layer" become SV transverse waves. That is, "a transverse wave" described in preferred embodiments of the present invention is not limited to a transverse wave at a material which is not anisotropic, but may preferably include a SH transverse wave and a SV transverse wave when an anisotropic material is used.

In preferred embodiments of the present invention, the piezoelectric layer preferably has a thickness within a range of from about 1λ to about 50λ, for example. Herein, the thickness of the piezoelectric layer represents a dimension in a lamination direction in which the piezoelectric layer and the dielectric layer are laminated.

Energy of vibration of the boundary acoustic wave to be used is primarily distributed within a range of from the boundary between the piezoelectric layer and the dielectric layer to a depth of about 1λ of the piezoelectric layer. Thus, when the boundary acoustic wave propagates, the thickness of the piezoelectric layer may be preferably at least about 1λ, for example. If the thickness of the piezoelectric layer is less than about 1λ, the energy distribution of the boundary acoustic wave may reach the low thermal expansion medium layer, and thus, frequency variations may be increased depending on the interface at which the piezoelectric layer and the low thermal expansion medium layer are bonded and variations in the thickness of the piezoelectric layer.

The overall linear thermal expansion coefficient of the boundary acoustic wave device is determined by a ratio of thicknesses of the piezoelectric layer, the dielectric layer, and the low thermal expansion medium layer. If the thickness of the piezoelectric layer is about 50λ or less, for example, the piezoelectric layer is not overly large. Thus, the overall linear thermal expansion coefficient of the boundary acoustic wave device can preferably be decreased, thereby decreasing the thickness of the low thermal expansion medium layer. Accordingly, the boundary acoustic wave device with a decreased overall thickness and having a good temperature characteristic can be provided.

Preferably, a sound absorbing layer is provided on a surface of the dielectric layer opposite to the boundary. Accordingly, the sound absorbing layer absorbs a high order mode spurious response which leaks to the surface of the dielectric layer opposite to the boundary. The high order mode spurious response can be further effectively suppressed.

Also, preferably, a structure arranged to scatter an elastic wave is provided at the surface of the dielectric layer opposite to the boundary. In this case, since the elastic wave that leaks to the surface of the dielectric layer opposite to the boundary is scattered, the high order mode spurious response can be further effectively suppressed. The structure arranged to scatter the elastic wave may be configured such that the surface of the dielectric layer opposite to the boundary is a rough surface, irregularities are provided at the surface, or inorganic or organic particles are adhered on the surface.

Preferably, a sound absorbing layer is provided between the piezoelectric layer and the low thermal expansion medium layer. In this case, the sound absorbing layer can absorb the high order mode that leaks to the surface of the piezoelectric layer opposite to the boundary. Accordingly, the high order mode spurious response can be further effectively suppressed.

In preferred embodiments of the present invention, the piezoelectric layer and the dielectric layer are preferably made of insulating materials. If the piezoelectric layer and the dielectric layer are made of insulating materials, an electroacoustic conversion characteristic of the IDT electrode is not significantly deteriorated. Accordingly, in a boundary acoustic wave resonator, a resonance characteristic or an anti-resonance characteristic is not significantly deteriorated, and in a boundary acoustic wave filter, a loss is not significantly increased. In particular, the piezoelectric layer and the dielectric layer are media in contact with the IDT electrode. When these media are semiconductor materials, such as Si, for example, electric current flows through the media. This may deteriorate the electroacoustic conversion characteristic of the IDT electrode. In contrast, when the piezoelectric layer and the dielectric layer are made of insulating materials, the electroacoustic conversion performance of the IDT electrode is not significantly deteriorated. Preferably, a resistance between IDT electrode portions connected to different potentials may be at least about 10 kΩ, for example.

With the boundary acoustic wave device according to the first preferred embodiment, since the low thermal expansion medium layer is laminated on the surface of the piezoelectric layer opposite to the boundary, the relationship among the acoustic velocities of the SH transverse waves in the boundary wave propagation direction at the piezoelectric layer, the dielectric layer, and the low thermal expansion medium layer satisfies Expression (1), and (the acoustic velocity of the transverse wave at the dielectric layer)/λ satisfies Expression (2), the high order mode spurious response can be effectively decreased. The reason for this is as follows.

The high order mode is generated when the acoustic velocity of the transverse wave at the piezoelectric layer is lower than the acoustic velocity of the transverse wave at the dielectric layer, and when the acoustic velocity of the SH wave at the piezoelectric layer is lower than the acoustic velocity of the transverse wave at the low thermal expansion medium layer. Otherwise, the high order mode leaks from the piezoelectric layer to the periphery. In contrast, when the acoustic velocity of the boundary acoustic wave is lower than those of the transverse waves at the piezoelectric layer and the dielectric layer, the boundary acoustic wave can propagate without a loss. Accordingly, as long as Expressions (1) and (2) are satisfied, the boundary acoustic wave can propagate without a loss, the high order mode can leak from the piezoelectric layer to the periphery, and thus, the high order mode spurious response can be effectively decreased.

Similarly, with the second preferred embodiment, since the relationship among the acoustic velocities of the SV transverse waves in the boundary wave propagation direction at the piezoelectric layer, the dielectric layer, and the low thermal expansion medium layer satisfies Expression (3), and (the acoustic velocity of the transverse wave at the dielectric layer)/λ satisfies Expression (4), the Stoneley boundary acoustic wave can be used while the high order mode of the Stoneley boundary acoustic wave can be effectively suppressed.

Therefore, with the first and second preferred embodiments, the boundary acoustic wave device can be provided, which can effectively suppress the high order mode spurious response by using the relatively simple structure in which the piezoelectric layer and the dielectric layer are laminated, and the low thermal expansion medium layer is laminated on the surface of the piezoelectric layer opposite to the boundary, and which can provide good resonance characteristics and good filter characteristics.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Specific preferred embodiments of the present invention will now be described with reference to the drawings.

Figure 1:
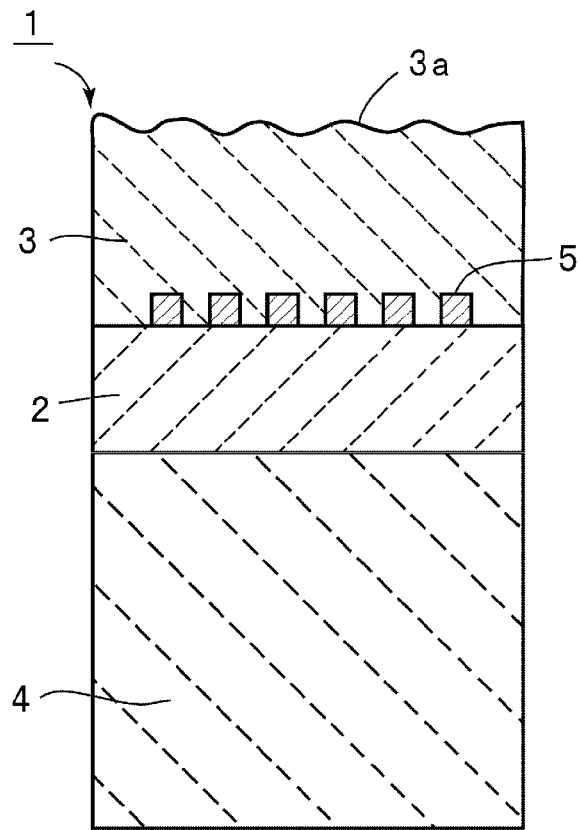
FIG. 1 is a schematic front cross-sectional view showing a boundary acoustic wave device according to a first preferred embodiment of the present invention.

FIG. 1 is a schematic front cross-sectional view showing a boundary acoustic wave device according to a first preferred embodiment of the present invention.

A boundary acoustic wave device 1 includes a piezoelectric layer 2, a dielectric layer 3 laminated on the piezoelectric layer 2, a low thermal expansion medium layer 4 laminated on a surface of the piezoelectric layer 2 opposite to the surface on which the dielectric layer 3 is provided, and an IDT electrode 5 provided at the boundary between the piezoelectric layer 2 and the dielectric layer 3. The boundary acoustic wave device 1 of this preferred embodiment uses a SH boundary acoustic wave that propagates at the boundary between the piezoelectric layer 2 and the dielectric layer 3.

The piezoelectric layer 2 may preferably use piezoelectric single crystal, such as $LiTaO_3$, $LiNbO_3$, or quartz crystal, for example.

The dielectric layer 3 may preferably use an inorganic dielectric material such as $SiO_2$, or an organic dielectric material, for example.

The low thermal expansion medium layer 4 is preferably made of a material with a linear thermal expansion coefficient less than that of the piezoelectric layer 2. Such a material may be, for example, Si, sapphire, or SiN.

In this preferred embodiment, an acoustic velocity of the SH wave at the piezoelectric layer 2 in a boundary acoustic wave propagation direction satisfies Expression (1), and when λ represents a wavelength of the IDT electrode 5, a relationship among (an acoustic velocity of a transverse wave at the dielectric layer)/λ, a response frequency of the boundary acoustic wave, and a response frequency of a high order mode of the boundary acoustic wave, satisfies Expression (2) as follows:

(acoustic velocity of transverse wave at dielectric layer)<(acoustic velocity of SH wave at piezoelectric layer)<(acoustic velocity of transverse wave at low thermal expansion medium layer)   Expression (1), and (response frequency of boundary acoustic wave)<(acoustic velocity of transverse wave at dielectric layer)/λ<(response frequency of high order mode)   Expression (2).

Herein, it is assumed that "a transverse wave at a dielectric layer" and "a transverse wave at a low thermal expansion medium layer" are S waves if these materials are not anisotropic, or these transverse waves are SH transverse waves if these materials are anisotropic. Also, it is assumed that "the acoustic velocity of the transverse wave at the dielectric layer" and "the acoustic velocity of the transverse wave at the low thermal expansion medium layer" include both of S waves and SH transverse waves.

The acoustic velocities of the SH wave, SV wave, S wave, P wave, etc., in the boundary acoustic wave propagation direction are respectively uniquely determined depending on the materials. Representative values of the acoustic velocities at the materials to be used as the piezoelectric layer, the dielectric layer, and the low thermal expansion medium layer are shown in Table 1, which will be provided later.

In Expression (2), (acoustic velocity of transverse wave at dielectric layer)/λ<(frequency response of high order mode) is a condition that cuts off the high order mode. The high order mode cannot be suppressed unless the condition is satisfied.

In this preferred embodiment, the dielectric layer 3 has a surface 3a including irregularities at the side opposite to the boundary between the piezoelectric layer 2 and the dielectric layer 3. The irregularities scatter the high order mode of the boundary acoustic wave propagating toward the surface 3a, so as to further decrease the effect of the high order mode spurious response on resonance characteristics and filter characteristics.

Instead of providing the irregularities, various structures may be used to scatter the high order mode. For example, the surface 3a may be a rough surface, or organic or inorganic particles may adhere onto the surface 3a.

The boundary acoustic wave device 1 of this preferred embodiment includes the low thermal expansion medium layer 4, and satisfies Expressions (1) and (2) described above. Thus, the high order mode spurious response can be decreased.

The low thermal expansion medium layer 4 has a linear thermal expansion coefficient less than that of the piezoelectric layer 2. Accordingly, deformation of the boundary acoustic wave device 1 caused by temperature changes is decreased, thereby improving a temperature characteristic. It is preferable that such a material with the smaller linear thermal expansion coefficient has a rigidity capable of suppressing the expansion of the piezoelectric layer. Thus, the material of the low thermal expansion medium layer 4 may preferably be a material, such as Si, sapphire, or SiN, for example, which allows a SH or Stoneley transverse wave to propagate at a high acoustic velocity.

Figure 2:
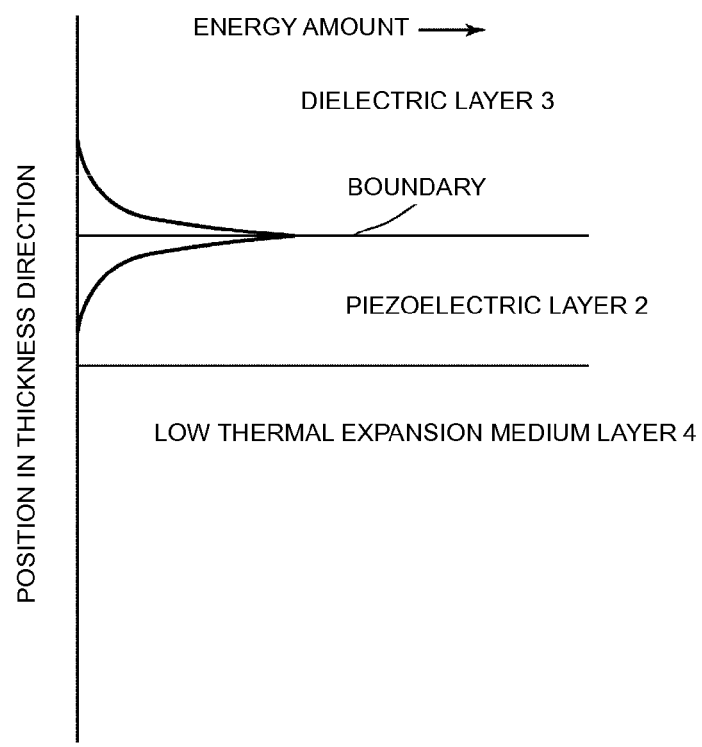
FIG. 2 is an illustration schematically showing an energy distribution of a SH boundary acoustic wave of the boundary acoustic wave device according to the first preferred embodiment of the present invention.

FIG. 2 is an illustration schematically showing an energy distribution of a boundary acoustic wave when the vertical axis plots a position in a thickness direction of the boundary acoustic wave device 1. The horizontal axis in FIG. 2 represents that vibration energy of the boundary acoustic wave increases toward the right side. Referring to FIG. 2, the energy distribution of the SH boundary acoustic wave to be used shows that the energy increases the most at the boundary between the piezoelectric layer 2 and the dielectric layer 3, and rapidly decreases as the position shifts away from the boundary. The energy of the boundary acoustic wave does not substantially reach the low thermal expansion medium layer 4. Thus, the boundary acoustic wave can propagate around the boundary between the piezoelectric layer 2 and the dielectric layer 3.

Figure 3:
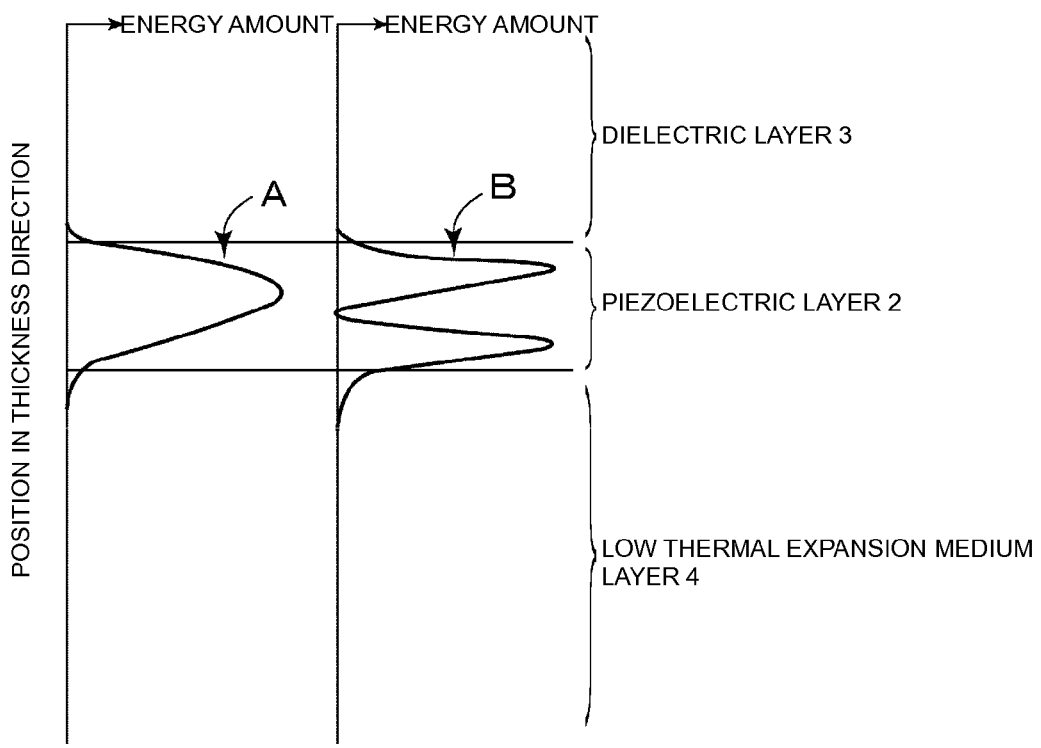
FIG. 3 is an illustration schematically showing an energy distribution in a high order mode which may cause a spurious response.

FIG. 3 is an illustration schematically showing an energy distribution of a high order mode which should be suppressed. Distributions of a high order mode A indicated by arrow A and a high order mode B indicated by arrow B both exhibit distributions of high energy within the piezoelectric layer 2. Thus, the high order modes A and B propagate while being substantially enclosed in the piezoelectric layer 2. A condition of the high order modes A and B propagating while being substantially enclosed in the piezoelectric layer 2 is that acoustic velocities of the high order modes are lower than the acoustic velocities of the transverse waves at the dielectric layer 3 and the low thermal expansion medium layer 4.

With the surface acoustic wave device described in Japanese Unexamined Patent Application Publication No. 2004-186868, no dielectric layer is provided on an IDT electrode. Thus, the acoustic velocity in a space above an upper surface of the piezoelectric layer 502 is approximately infinite. The high order mode propagates while being substantially enclosed in the boundary between the piezoelectric layer and the space above the piezoelectric layer, i.e., on the surface of the piezoelectric layer.

In contrast, with the boundary acoustic wave device 1, the dielectric layer 3 is arranged on the IDT electrode 5. Here, in the boundary acoustic wave device primarily using the SH component, the boundary acoustic wave can propagate without a loss because no leakage occurs as long as the acoustic velocity of the SH wave at the piezoelectric layer 2 and the acoustic velocity of the transverse wave at the dielectric layer 3 are higher than the acoustic velocity of the boundary acoustic wave to be used. Meanwhile, the acoustic velocity of a SH wave and the acoustic velocity of a longitudinal wave at the piezoelectric layer 2 are higher than the acoustic velocity of the boundary acoustic wave, and thus, the high order mode in which a transverse wave and a longitudinal wave propagate as main components while being coupled to each other and being enclosed in the piezoelectric layer 2 generally has a higher acoustic velocity than that of the boundary acoustic wave.

In this preferred embodiment, the acoustic velocity of the transverse wave at the dielectric layer is lower than the acoustic velocity of the SH wave at the piezoelectric layer 2 and the acoustic velocity of the transverse wave at the low thermal expansion medium layer 4. That is, the piezoelectric layer 2, the dielectric layer 3, and the low thermal expansion medium layer 4 satisfy the relationship of Expression (1). In addition, since the acoustic velocity of the transverse wave at the dielectric layer 3 is set between the acoustic velocity of the boundary acoustic wave and the acoustic velocity of the high order mode, that is, since Expression (2) is satisfied, the SH boundary acoustic wave to be used propagates without a loss. The high order mode which may cause a spurious response can be attenuated as a leaky wave that leaks to the dielectric layer 3.

With this preferred embodiment, the high order mode spurious response can be decreased, and good resonance characteristics and filter characteristics can be provided.

Boundary acoustic waves include a SH boundary acoustic wave primarily having a SH component and a Stoneley wave primarily having P+SV components, i.e., a P+SV boundary acoustic wave. The SH boundary acoustic wave and the Stoneley wave may propagate while respectively having only the SH component and the P+SV components. If piezoelectric single crystal, such as LiTaO$_3$ or LiNbO$_3$, for example, which is anisotropic crystal, is used as the piezoelectric layer, the three components of P, SH, and SV are typically coupled to each other and then propagate in many substrate directions of the piezoelectric layer.

For example, the boundary acoustic wave device 1 is preferably configured such that the piezoelectric layer 2 uses Y-cut X-propagation LiTaO$_3$, the dielectric layer 3 uses SiO$_2$, the lower thermal expansion medium layer uses polycrystalline Si, and the IDT electrode 5 uses an Au film with a sufficient thickness. In this case, the SH boundary acoustic wave propagates at the boundary between the piezoelectric layer 2 and the dielectric layer 3. The acoustic velocity of the shear horizontal wave, or SV wave is about 3351 m/sec, which is lower than the acoustic velocity of the transverse wave at SiO$_2$ of about 3757 m/sec. Accordingly, energy of the SV component of the high order mode leaks to the dielectric layer 3, and the high order mode can be diffused. However, the acoustic velocity of the SH wave (main component) is about 4227 m/sec, which is higher than the acoustic velocity of the transverse wave at SiO$_2$. The energy of the SH component of the high order mode has difficulty leaking, and thus, it is difficult to reliably attenuate the energy.

In the propagation of the SH boundary acoustic wave, the high order mode primarily having the SH component is highly excited. Therefore, the high order mode primarily having the SH component is preferably attenuated as the leaky wave. When the SH boundary acoustic wave is used, the transverse wave at the piezoelectric layer may preferably be a SH wave. When the Stoneley boundary acoustic wave is used, the transverse wave may preferably be a SV wave.

If the Stoneley boundary acoustic wave is used, the acoustic velocity of the SV wave at the piezoelectric layer may preferably satisfy Expression (3), and when λ represents the wavelength of the IDT electrode, a response frequency of the Stoneley boundary acoustic wave, a response frequency of the high order mode of the boundary acoustic wave, and the acoustic velocity of the transverse wave at the dielectric layer may preferably satisfy a range defined by Expression (4) as follows:

(acoustic velocity of transverse wave at dielectric layer)<(acoustic velocity of SV wave at piezoelectric layer)<(acoustic velocity of transverse wave at low thermal expansion medium layer)

Expression (3), and (response frequency of boundary acoustic wave)<(acoustic velocity of transverse wave at dielectric layer)/λ<(response frequency of high order mode)

Expression (4).

The transverse waves in Expressions (3) and (4) are S waves when the materials of the dielectric layer and the low thermal expansion medium layer are not anisotropic. The transverse waves are SV waves when the materials are anisotropic. That is, the above-mentioned "transverse wave" includes the SV wave if the material is anisotropic, in addition to the transverse wave, which is the S wave.

Preferably, the dielectric layer 3 and the piezoelectric layer 2 may be made of insulating materials as in this preferred embodiment. When the dielectric layer 3 and the piezoelectric layer 2 are made of semiconductors, electric current flows from the IDT electrode 5 to the semiconductors, and an electroacoustic conversion performance of the IDT electrode 5 may be deteriorated. In contrast, when the dielectric layer 3 and the piezoelectric layer 2 are made of insulating materials, the electroacoustic conversion performance of the IDT electrode 5 is not significantly deteriorated. Thus, the electric characteristic of the boundary acoustic wave device, for example, a resonant resistance or an anti-resonant resistance, or an insertion loss is not significantly deteriorated. More preferably, a resistance at a portion between electrodes connected to different potentials of the IDT electrode 5 may be at least about 10 kΩ, for example.

Figure 4:
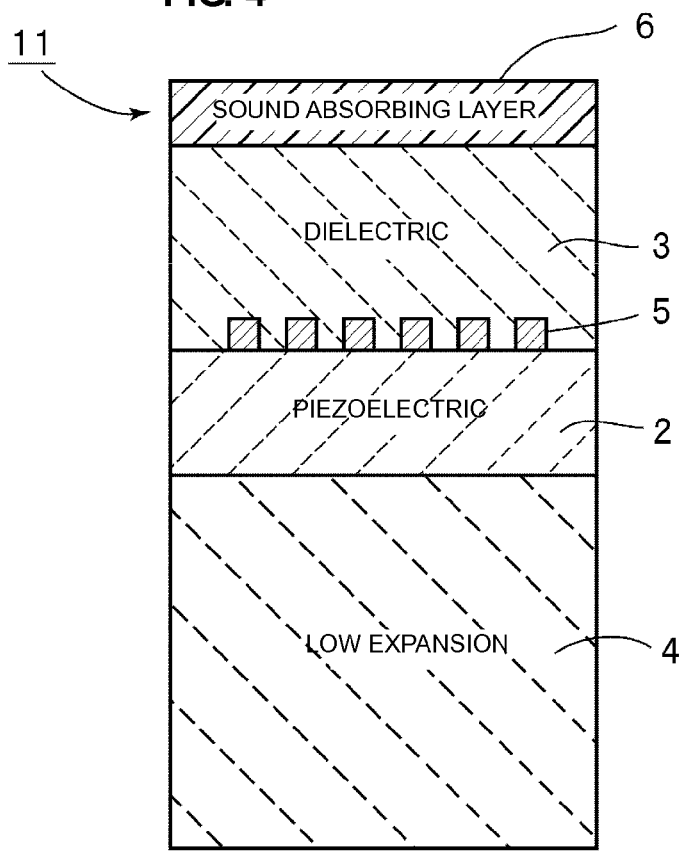
FIG. 4 is a schematic front cross-sectional view showing a boundary acoustic wave device according to a second preferred embodiment of the present invention.
Figure 5:
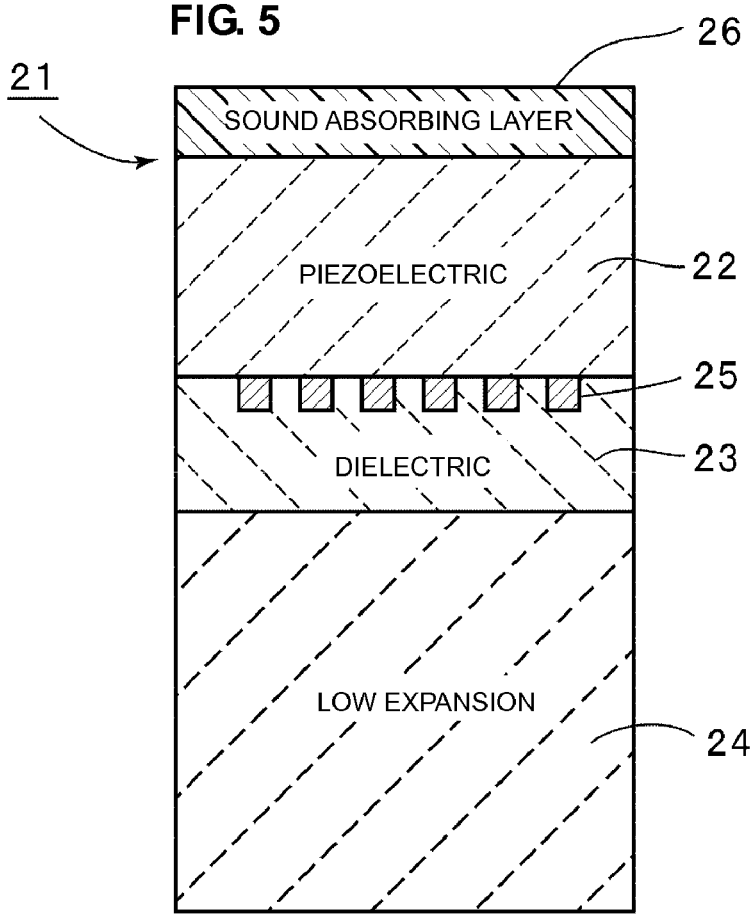
FIG. 5 is a schematic front cross-sectional view showing a boundary acoustic wave device prepared as a comparative example.

FIG. 4 is a schematic front cross-sectional view showing a boundary acoustic wave device 11 according to a second preferred embodiment of the present invention. FIG. 5 is a schematic front cross-sectional view showing a boundary acoustic wave device 21 prepared as a comparative example.

The boundary acoustic wave devices 11 and 21 will be described with reference to specific examples to clarify the structure and advantages of the boundary acoustic wave device 11 of this preferred embodiment.

Referring to FIG. 4, the boundary acoustic wave device 11 includes a piezoelectric layer 2, a dielectric layer 3, and a low thermal expansion medium layer 4 laminated on a surface of the piezoelectric layer 2 opposite to the boundary wave between the piezoelectric layer 2 and the dielectric layer 3, in a similar manner to the boundary acoustic wave device 1. An IDT electrode 5 is arranged at the boundary wave between the piezoelectric layer 2 and the dielectric layer 3. Further, in this preferred embodiment, a sound absorbing layer 6 is laminated on a surface 3a of the dielectric layer 3 opposite to the boundary.

In this preferred embodiment, the boundary acoustic wave device 11 is configured to satisfy Expressions (1) and (2) mentioned above. Therefore, a high order mode of a boundary acoustic wave leaks to the dielectric layer 3, and a high order mode spurious response caused by the high order mode is decreased. In contrast, a SH or Stoneley boundary acoustic wave to be used propagates around the boundary substantially without a loss, and thus, good resonance characteristics and good filter characteristics can be provided.

In addition, in this preferred embodiment, since the sound absorbing layer 6 is provided, the sound absorbing layer 6 absorbs the high order mode that propagates to the surface 3a of the dielectric layer 3. Accordingly, the high order mode spurious response can be decreased. The material of the sound absorbing layer 6 is not particularly limited as long as the material can absorb the high order mode. For example, the material may preferably be an organic material such as synthetic resin, or a porous inorganic material, such as porous silica, porous alumina, porous titanium oxide, porous glass, porous magnesia (MgO), or porous aluminum. The synthetic resin may preferably be polyimide, silicone resin, or epoxy resin, for example.

The thickness of the sound absorbing layer 6 is not particularly limited as long as the sound absorbing layer 6 can absorb the propagating high order mode. To reliably absorb the high order mode, the thickness is preferably at least about $1.0\lambda$, for example. If the thickness of the sound absorbing layer 6 is too large, the thickness of the boundary acoustic wave device 11 may be too large, which is not desirable. Thus, the thickness of the sound absorbing layer 6 may preferably be 200 μm or less, for example.

Next, an advantage of the boundary acoustic wave device 11 having the sound absorbing layer 6, in which the high order mode is effectively suppressed, is described with reference to the specific example.

The boundary acoustic wave device 11 was manufactured with the following specifications:

piezoelectric layer 2 of 15° Y-cut X-propagation LiNbO$_3$ having a thickness of about $4\lambda$;

dielectric layer 3 of SiO$_2$ having a thickness of about $5\lambda$k and having irregularities at surface 3a;

low thermal expansion medium layer 4 of polycrystalline Si having a thickness of about $50\lambda$;

sound absorbing layer 6 of polyimide having a thickness of about $3\lambda$; and IDT electrode of Au having a thickness of about $0.05\lambda$ and having a duty of about 0.6.

For comparison, a boundary acoustic wave device 21 shown in FIG. 5 was manufactured. The boundary acoustic wave device 21 includes an IDT electrode 25 arranged at the interface between a piezoelectric layer 22 and a dielectric layer 23. A low thermal expansion medium layer 24 is laminated on a surface 23a of the dielectric layer 23 opposite to the boundary between the piezoelectric layer 22 and the dielectric layer 23. Further, a sound absorbing layer 26 is laminated on a surface 22a of the piezoelectric layer 22 opposite to the boundary. During manufacturing, the IDT electrode 25 was formed on the piezoelectric layer, and a dielectric film was formed so as to cover the IDT electrode. Then, the dielectric film was polished by chemical-mechanical polishing (CMP), and the polished dielectric layer surface and the surface of the low thermal expansion medium layer 24 were activated and bonded with each other.

The specifications of the boundary acoustic wave 21 are as follows:

Piezoelectric layer 22 of 15° Y-cut X-propagation LiNbO$_3$ having a thickness of about $125\lambda$;

irregularities being provided at a surface of the piezoelectric layer 22 opposite to the side formed with the IDT electrode 25;

dielectric layer 23 of SiO$_2$ having a thickness of about $4\lambda$;

low thermal expansion medium layer 24 of polycrystalline Si having a thickness of about $10\lambda$;

sound absorbing layer 26 of polyimide; and

IDT electrode 25 of Au having a thickness of about $0.05\lambda$ and having a duty of about 0.6.

In the boundary acoustic wave device 11 of the above-described preferred embodiment and the boundary acoustic wave device 21 of the comparative example, the IDT electrode 5, 25 was arranged to define a one-port boundary acoustic wave resonator.

Figure 6:
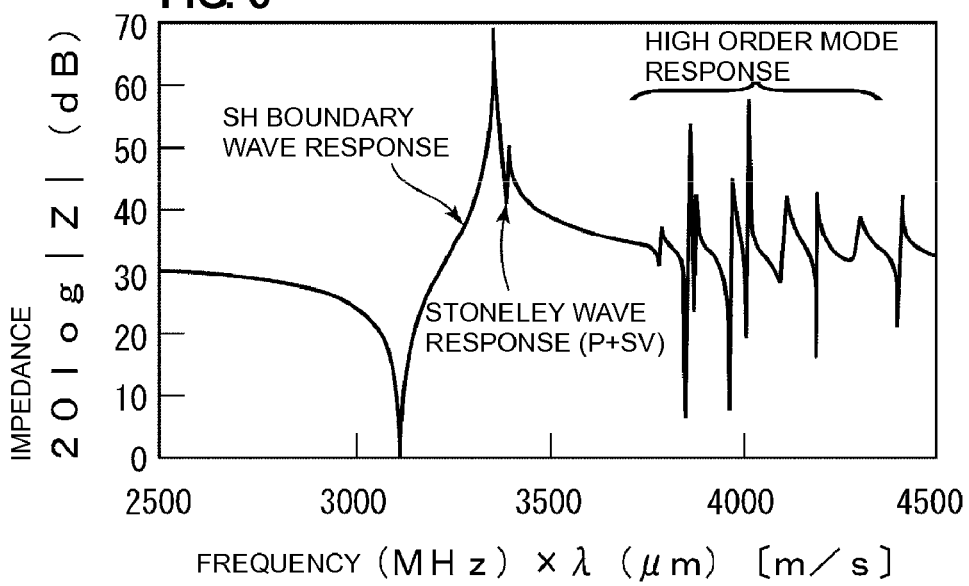
FIG. 6 is an illustration showing an impedance characteristic of the boundary acoustic wave device as the comparative example shown in FIG. 5.
Figure 7:
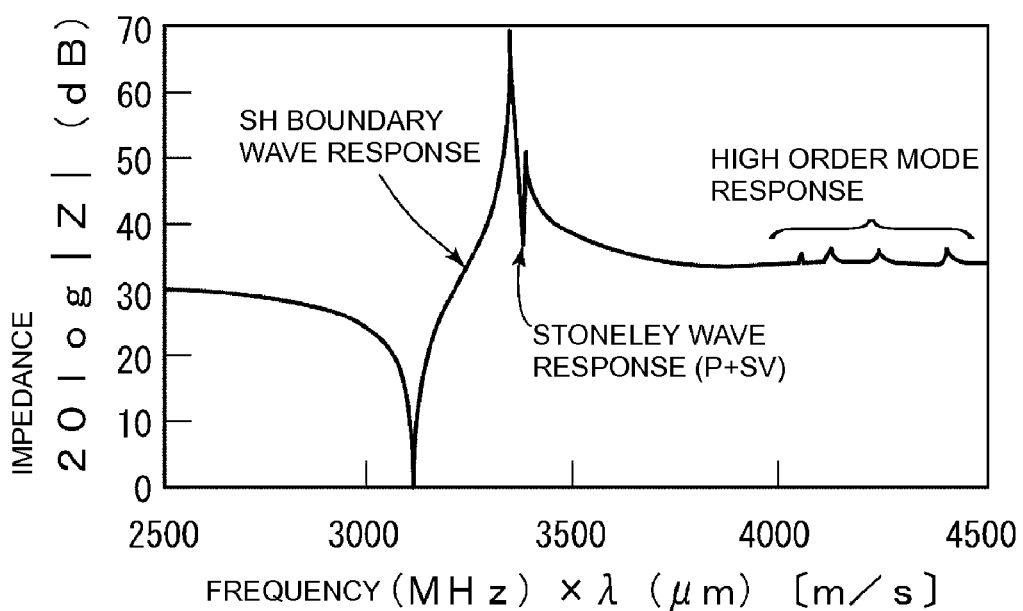
FIG. 7 is an illustration showing an impedance characteristic of the boundary acoustic wave device according to the second preferred embodiment of the present invention.

FIG. 7 shows an impedance characteristic of the boundary acoustic wave device 11 of the preferred embodiment manufactured as described above. FIG. 6 shows an impedance characteristic of the boundary acoustic wave device 21 of the comparative example. As shown in FIG. 6, the boundary acoustic wave device of the comparative example generates a relatively large high order mode spurious response. In particular, the boundary acoustic wave device 21 has a relatively large high order mode spurious response although the thickness of the piezoelectric layer 22 is sufficiently large, the irregularities are provided at the surface 22a of the piezoelectric layer 22, and the sound absorbing layer 26 is laminated.

In contrast, as shown in FIG. 7, the boundary acoustic wave device 11 of the preferred embodiment generates only a small high order mode spurious response.

Figure 8:
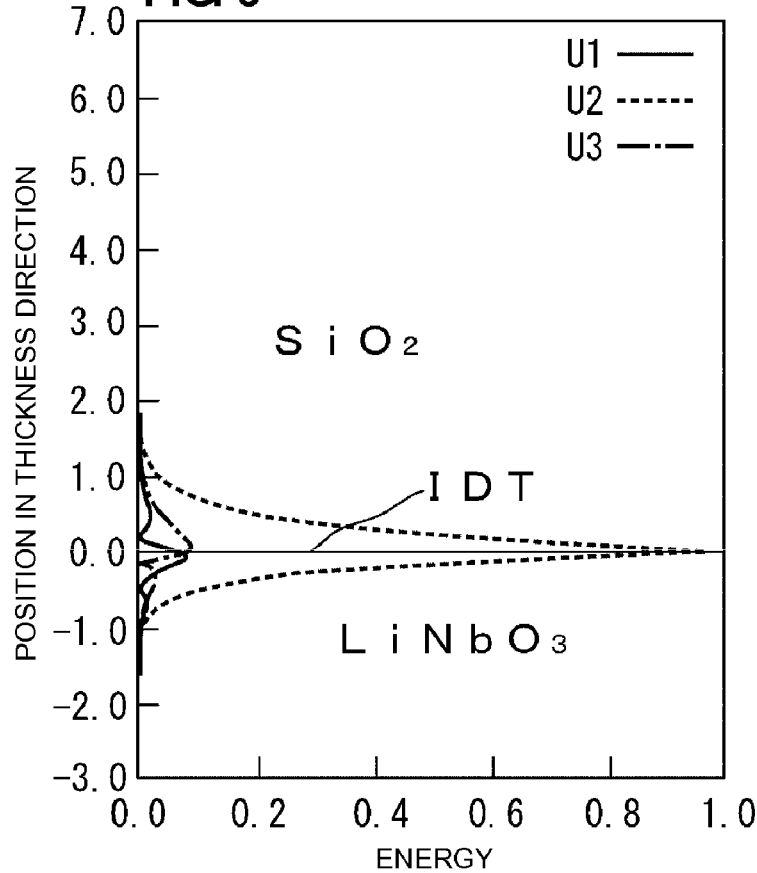
FIG. 8 is an illustration schematically showing an energy distribution of a SH boundary acoustic wave of the boundary acoustic wave device according to the comparative example or the second preferred embodiment of the present invention.

FIG. 8 is a schematic illustration showing an energy distribution of a SH boundary wave in the preferred embodiment and in the boundary acoustic wave device 21 of the comparative example. In FIG. 8, the vertical axis plots a position in a thickness direction of the boundary acoustic wave device 21, in which 0.0 represents the boundary between the piezoelectric layer 22 and the dielectric layer 23. The horizontal axis plots energy (a standardized value). The standardized value of the energy is standardized while the largest energy is defined as 1.0.

As shown in FIG. 8, vibration is concentrated at the boundary portion of the piezoelectric layer 22 and the dielectric layer 23 provided with the IDT electrode. Since the largest displacement appears at this portion, and the vibration is evanescently attenuated at the piezoelectric layer 22 and the dielectric layer 23, a vibration mode is a non-leaky mode, that is, without a propagation loss. In FIG. 8, character reference U1 denotes a P component of the boundary acoustic wave, U2 denotes a SH component, and U3 denotes a SV component.

Figure 9:
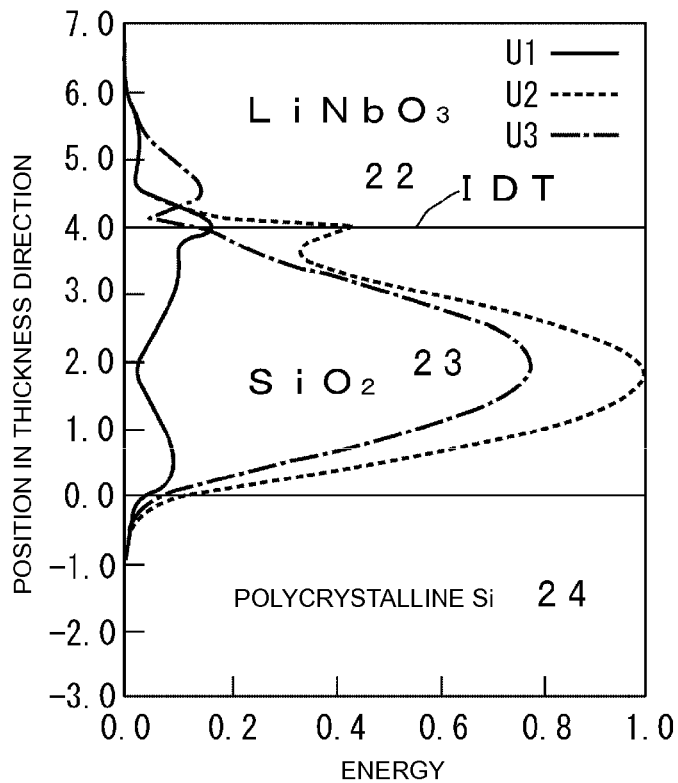
FIG. 9 is an illustration schematically showing an energy distribution of a high order mode of the boundary acoustic wave device according to the comparative example.
Figure 10:
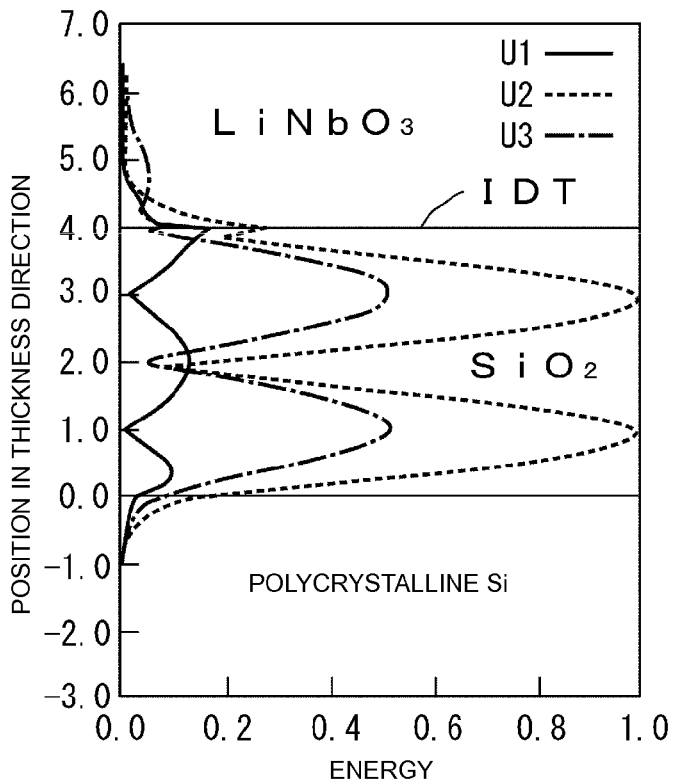
FIG. 10 is an illustration schematically showing an energy distribution of a high order mode of the boundary acoustic wave device according to the comparative example.

FIGS. 9 and 10 are schematic illustrations showing an energy distribution of a high order mode spurious response of the boundary acoustic wave device 21 of the above-described comparative example. In FIGS. 9 and 10, character reference U1 denotes a P component of the high order mode, U2 denotes a SH component, and U3 denotes a SV component. Vibration of the high order mode is concentrated at the dielectric layer 23. The largest shift appears in the dielectric layer 23. Vibration is evanescently attenuated at the piezoelectric layer 22 and the low thermal expansion medium layer 24. The vibration is in a non-leaky vibration mode. Therefore, it is difficult to attenuate the high order mode although the thickness of the piezoelectric layer is increased as large as about 125λ, for example, the irregularities are provided at the surface of the piezoelectric layer 22, and the sound absorbing layer 26 is provided.

Figure 11:
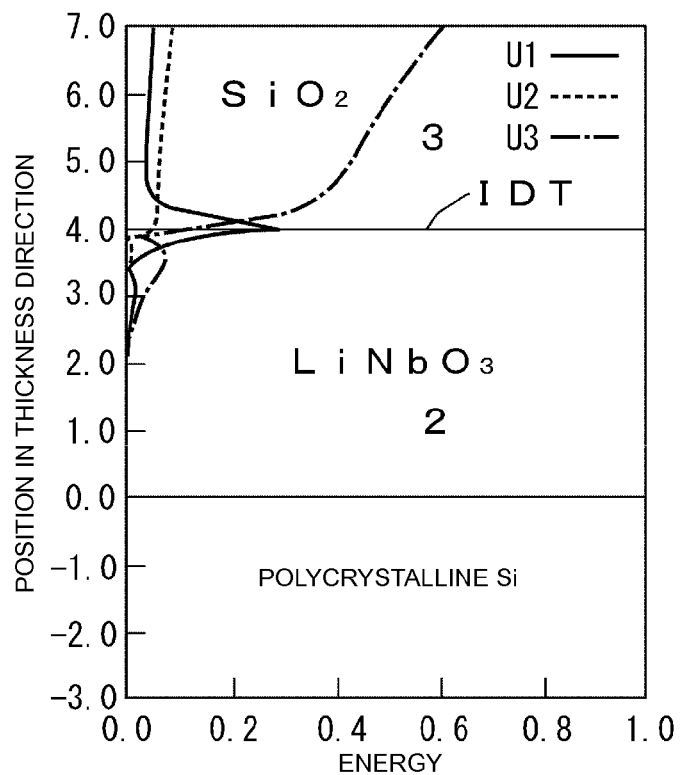
FIG. 11 is an illustration schematically showing an energy distribution of a high order mode of the boundary acoustic wave device according to the second preferred embodiment of the present invention.
Figure 12:
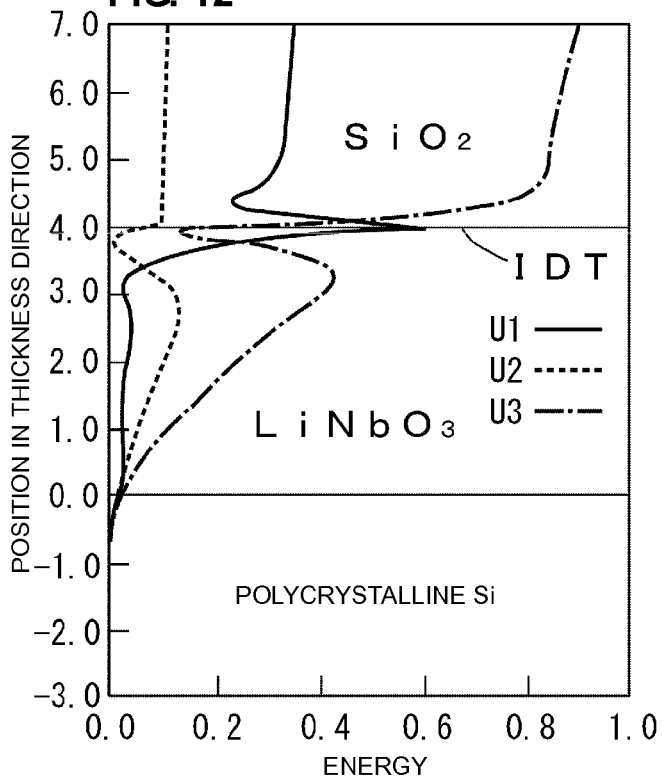
FIG. 12 is an illustration schematically showing an energy distribution of a high order mode of the boundary acoustic wave device according to the second preferred embodiment of the present invention.

On the other hand, FIGS. 11 and 12 show an energy distribution of a high order mode spurious response of the boundary acoustic wave device according to the preferred embodiment. The energy distribution of the SH boundary wave, which is a main mode, is similar to that in FIG. 8 provided as the comparative example.

In FIGS. 11 and 12, character reference U1 denotes a P component, U2 denotes a SH component, and U3 denotes a SV component.

As shown in FIGS. 11 and 12, the vibration of the high order mode is not concentrated at the piezoelectric layer 2, and it leaks to the dielectric layer 3. Therefore, the vibration is in the leaky vibration mode. Accordingly, in the above-described preferred embodiment, since the high order mode leaks to the surface of the dielectric layer 3 opposite to the boundary, and the irregularities are provided at the surface 3a of the dielectric layer 3, the high order mode is scattered and absorbed by the sound absorbing layer 6. The high order mode spurious response can be effectively suppressed.

Table 1 shows acoustic velocities of transverse waves at media of the boundary acoustic wave device 11 of a preferred embodiment of the present invention, and those of the boundary acoustic wave device 21 of the comparative example.

TABLE 1

| | SV wave (m/s) | SH wave (m/s) | S wave (m/s) | P wave (m/s) |
|---|---|---|---|---|
| LiNbO$_3$ | 4031 | 4752 | — | 6547 |
| Au | — | — | 1245 | 3378 |
| SiO$_2$ | — | — | 3757 | 5960 |
| polycrystalline Si | — | — | 5341 | 8945 |

In the boundary acoustic wave device 21 of the comparative example, a high order mode spurious response is generated when the value of a frequency×λ of the high order mode spurious response is greater than the acoustic velocity of the transverse wave at SiO$_2$ defining the dielectric layer, i.e., the acoustic velocity of the S wave of about 3757 m/sec. In the boundary acoustic wave device 11 of a preferred embodiment of the present invention, a high order mode spurious response is only slightly generated when the value of a frequency×λ of the high order mode spurious response is greater than the acoustic velocity of the transverse wave at LiNbO$_3$, i.e., the acoustic velocity of the SV wave of about 4031 m/sec.

As described above, the high order mode spurious response that occurs is restricted by the acoustic velocity of the medium generated by the IDT electrode. Accordingly, with a preferred embodiment of the present invention, since the acoustic velocity of the transverse wave at the piezoelectric layer 2 is lower than the acoustic velocity of the transverse wave of the dielectric layer 3, the high order mode spurious response occurs when frequency×λ is greater than the acoustic velocity of the dielectric layer 3, the high order mode spurious response can define the leaky wave. While the boundary acoustic wave device 11 of the second preferred embodiment uses the SH boundary wave for example, the boundary acoustic wave device 11 may use a Stoneley boundary acoustic wave in a similar manner to the first preferred embodiment.

As described above, since the boundary acoustic wave device of various preferred embodiments of the present invention has the layer structure including (the sound absorbing layer provided if necessary,) the dielectric layer, the IDT electrode, the piezoelectric layer, and the low thermal expansion medium layer, that is, since the device has the relatively simple layer structure, the high order mode spurious response can be effectively suppressed. Also, by laminating the low thermal expansion medium layer, characteristic changes resulting from temperature changes can be decreased. Thus, when an oscillation circuit includes the boundary acoustic wave resonator of a preferred embodiment the present invention, the occurrence of abnormal vibration is greatly decreased. Also, when a band-pass filter is defined by the boundary acoustic wave device of a preferred embodiment of the present invention, a high order mode spurious response is not significantly generated, thereby providing good filter characteristics.

Figure 13:
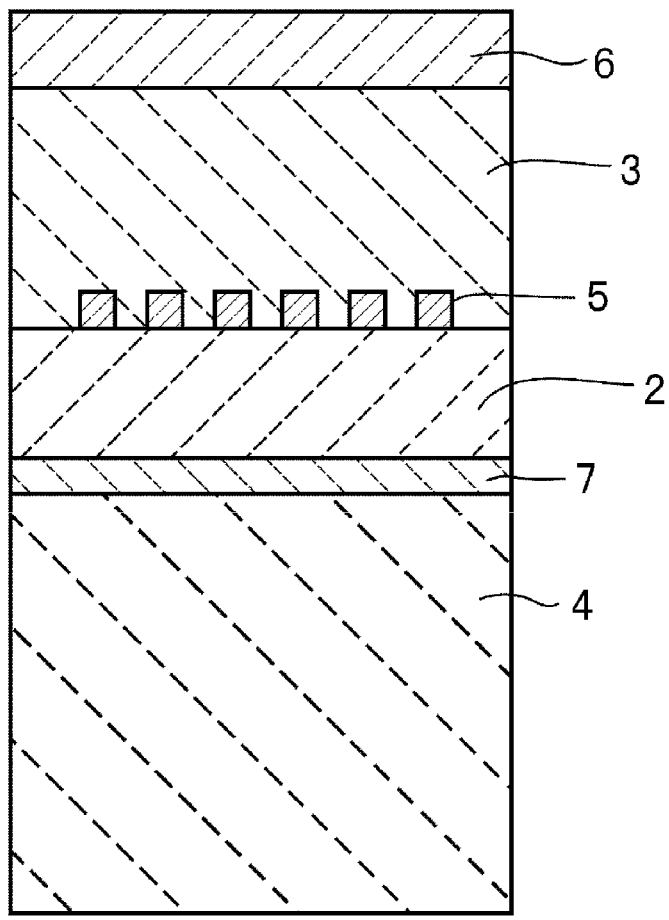
FIG. 13 is a schematic front cross-sectional view showing a modification of the boundary acoustic wave device according to the second preferred embodiment of the present invention.
Figure 14:
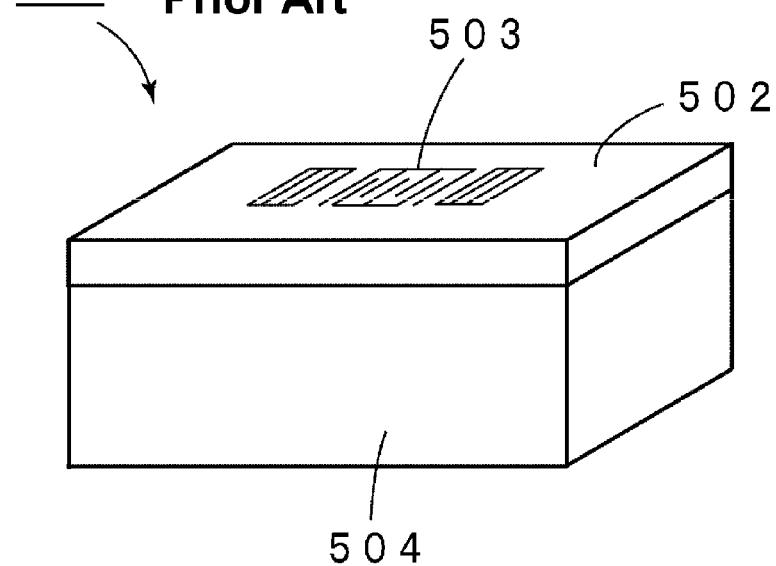
FIG. 14 is a schematic front cross-sectional view showing an example of a conventional surface acoustic wave device.

While the low thermal expansion medium layer 4 is directly laminated on the piezoelectric layer 2 in the first and second preferred embodiments, a sound absorbing layer 7 may be additionally provided between the piezoelectric layer 2 and the low thermal expansion medium layer 4 as shown in FIG. 13. When the sound absorbing layer 7 is provided, in order to transmit a stress from the low thermal expansion medium layer 4 to the piezoelectric layer 2, it is preferable that the sound absorbing layer 7 is relatively thin or that the sound absorbing layer 7 is made of a hard material. Thus, when the sound absorbing layer 7 is made of a resin material with a Young's modulus of several Gpa, such as epoxy resin, for example, it is preferable that the thickness of the sound absorbing layer 7 is several λ or less, for example. Alternatively, the sound absorbing layer 7 may preferably be made of a material as hard as SOG (spin-on glass), for example, and having a lower density than that of SiO$_2$. As another alternative, the sound absorbing layer 7 may preferably be defined by a structure in which metal is dispersed at the interface between the piezoelectric layer 2 and the low thermal expansion medium layer 4 and a crystal structure at the interface portion is broken.

The above-described piezoelectric layer 2 may preferably be made of other materials, for example, ZnO, Ta$_2$O$_5$, PZT, AlN, LiTaO$_3$, or KN. The above-described dielectric layer 3 may preferably be formed of other materials, for example, SiO$_2$, SiC, Al$_2$O$_3$, DLC, ZnO, Ta$_2$O$_5$, PZT, AlN, LiTaO$_3$, or KN.

In addition, the material of the low thermal expansion medium layer 4 is not particularly limited to the above-mentioned polycrystalline Si, and may preferably be other material, such as polycrystalline Si, SiC, Al$_2$O$_3$, Al$_2$O$_3$, sapphire, or diamond like carbon (DLC), for example.

Furthermore, the low thermal expansion medium layer 4 may be bonded and attached to the piezoelectric layer 2. Alternatively, the material of the low thermal expansion medium layer may preferably be formed by a film-forming method. Such a film-forming method may be sputtering, CVD, depositing, or coating, for example.

Further, in the boundary acoustic wave device of preferred embodiments of the present invention, a protection layer may preferably be provided on the outer side of the layer structure including (the sound absorbing layer provided if necessary,) the dielectric layer, the IDT electrode, the piezoelectric layer, and the low thermal expansion medium layer. By providing the protection layer, the strength of the boundary acoustic wave device can be increased, and corrosive gas can be prevented from entering. The material of the protection layer is not particularly limited, and may preferably be an insulating material, for example, synthetic resin, such as polyimide or epoxy resin, or an inorganic material, such as titanium oxide, aluminum nitride, or aluminum oxide. Alternatively, the protection layer may be defined by a metal film made of, for example, Au, Al or W.

The boundary acoustic wave device of preferred embodiments of the present invention may preferably be enclosed in another package with or without the above-described protection layer.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
   a piezoelectric layer;
   a dielectric layer laminated on the piezoelectric layer;
   an IDT electrode arranged at an interface between the piezoelectric layer and the dielectric layer; and
   a low thermal expansion medium layer laminated on a surface of the piezoelectric layer opposite to the interface and made of a material having a linear thermal expansion coefficient less than that of the piezoelectric layer; wherein
   the boundary acoustic wave device has a structure the propagates a SH boundary acoustic wave at the boundary between the piezoelectric layer and the dielectric layer; and
   an acoustic velocity of a SH wave at the piezoelectric layer satisfies Expression (1), and when λ represents a wavelength of the IDT electrode, (an acoustic velocity of a transverse wave at the dielectric layer)/λ with respect to a response frequency of the SH boundary acoustic wave and to a response frequency in a high order mode satisfies Expression (2) as follows:

(acoustic velocity of transverse wave at dielectric layer)<(acoustic velocity of SH wave at piezoelectric layer)<(acoustic velocity of transverse wave at low thermal expansion medium layer)  Expression (1); and (response frequency of boundary acoustic wave)<(acoustic velocity of transverse wave at dielectric layer)/λ<(response frequency of high order mode)  Expression (2).

2. The boundary acoustic wave device according to claim 1, wherein the piezoelectric layer has a thickness in a range of about 1= to about 50λ.

3. The boundary acoustic wave device according to claim 1, wherein a sound absorbing layer is laminated on a surface of the dielectric layer opposite to the interface.

4. The boundary acoustic wave device according to claim 1, wherein a structure arranged to scatter an elastic wave propagating to a surface of the dielectric layer opposite to the interface is provided at the surface of the dielectric layer opposite to the interface.

5. The boundary acoustic wave device according to claim 1, further comprising a sound absorbing layer provided between the piezoelectric layer and the low thermal expansion medium layer.

6. The boundary acoustic wave device according to claim 1, wherein the piezoelectric layer and the dielectric layer are made of insulating materials.

7. A boundary acoustic wave device comprising:
   a piezoelectric layer;
   a dielectric layer laminated on the piezoelectric layer;
   an IDT electrode arranged at an interface between the piezoelectric layer and the dielectric layer; and
   a low thermal expansion medium layer laminated on a surface of the piezoelectric layer opposite to the interface and made of a material having a linear thermal expansion coefficient less than that of the piezoelectric layer; wherein
   the boundary acoustic wave device has a structure that propagates a Stoneley boundary acoustic wave at the boundary between the piezoelectric layer and the dielectric layer; and
   an acoustic velocity of a SV wave at the piezoelectric layer satisfies Expression (1), and when λ represents a wavelength of the IDT electrode, (an acoustic velocity of a transverse wave at the dielectric layer)/λ with respect to a response frequency of the Stoneley boundary acoustic wave and to a response frequency in a high order mode satisfies Expression (2) as follows:

(acoustic velocity of transverse wave at dielectric layer)<(acoustic velocity of SV wave at piezoelectric layer)<(acoustic velocity of transverse wave at low thermal expansion medium layer)  Expression (1), and (response frequency of boundary acoustic wave)<(acoustic velocity of transverse wave at dielectric layer)/λ<(response frequency of high order mode)  Expression (2).

8. The boundary acoustic wave device according to claim 7, wherein the piezoelectric layer has a thickness in a range of about 1λ to about 50λ.

9. The boundary acoustic wave device according to claim 7, wherein a sound absorbing layer is laminated on a surface of the dielectric layer opposite to the interface.

10. The boundary acoustic wave device according to claim 7, wherein a structure arranged to scatter an elastic wave propagating to a surface of the dielectric layer opposite to the interface is provided at the surface of the dielectric layer opposite to the interface.

11. The boundary acoustic wave device according to claim 7, further comprising a sound absorbing layer provided between the piezoelectric layer and the low thermal expansion medium layer.

12. The boundary acoustic wave device according to claim 7, wherein the piezoelectric layer and the dielectric layer are made of insulating materials.

* * * * *